(12) United States Patent
Hennekes et al.

(10) Patent No.: US 6,507,185 B1
(45) Date of Patent: Jan. 14, 2003

(54) DEVICE, ASSEMBLY AND METHOD FOR TESTING ELECTRONIC COMPONENTS, AND CALIBRATING METHOD THEREFOR

(75) Inventors: Willem Antonie Hennekes, De Hoge Hoeve (NL); Antoon Willem Pothoven, De Bonkelaar (NL)

(73) Assignee: FICO B.V. (NL)

( * ) Notice: Subject to any disclaimer, the term of this patent is extended or adjusted under 35 U.S.C. 154(b) by 0 days.

(21) Appl. No.: 09/646,822

(22) PCT Filed: Mar. 24, 1999

(86) PCT No.: PCT/NL99/00166

§ 371 (c)(1),
(2), (4) Date: Nov. 9, 2000

(87) PCT Pub. No.: WO99/49328

PCT Pub. Date: Sep. 30, 1999

(30) Foreign Application Priority Data

Mar. 25, 1998 (NL) .............................................. 1008697

(51) Int. Cl.⁷ .............................................. G01R 31/02
(52) U.S. Cl. .................................................. 324/158.1
(58) Field of Search .................. 324/158.1; 414/222.01, 414/222.04, 222.05, 222.07, 222.08, 222.09, 222.1, 222.11, 222.13, 403, 413

(56) References Cited

U.S. PATENT DOCUMENTS 5,151,650 A * 9/1992 Frisbie et al. ................ 324/158
5,686,834 A   11/1997 Okudaira et al.
6,008,636 A * 12/1999 Miller et al. ............. 324/158.1

FOREIGN PATENT DOCUMENTS

| GB | 2285139 | 6/1995 |
| WO | 9204989 | 4/1992 |
| WO | 9729383 | 8/1997 |

* cited by examiner

Primary Examiner—Michael Sherry
Assistant Examiner—Russell M. Kobert
(74) Attorney, Agent, or Firm—Webb Zeisenheim Logsdon Orkin & Hanson, P.C.

(57) ABSTRACT

The invention relates to a test device for testing electronic components mounted on a carrier such as a lead frame, comprising: a transport path for supplying a carrier for testing; a manipulator for engaging and displacing a supplied carrier; a test contact with which a carrier and/or at least one component mounted on the carrier can be placed in contact by the manipulator; and a transport path for discharging a tested carrier. The invention also embraces a test assembly which includes at least one described test device. The invention furthermore provides a method for testing electronic components mounted on a carrier and method for calibrating a test device.

6 Claims, 2 Drawing Sheets

DEVICE, ASSEMBLY AND METHOD FOR TESTING ELECTRONIC COMPONENTS, AND CALIBRATING METHOD THEREFOR

BACKGROUND OF THE INVENTION

The invention relates to a test device for testing electronic components mounted on a carrier such as a lead frame or substrate. The invention also relates to a test assembly of which at least one such test device forms part. In addition, the invention provides a method for testing electronic components mounted on a carrier such as a lead frame and a method for calibrating a test device.

The testing of electronic components, particularly semiconductors, usually takes place according to the prior art after a plurality of electronic components have been placed on a carrier. The carrier is subsequently subdivided into segments on which one component is situated in each case. The separate carrier segments with electronic components mounted thereon are individually placed for testing against for instance a test contact with which the measurement is performed.

The present invention has for its object to provide an improved test device and method for testing electronic components with which testing can take place in accurate manner at relatively high speed.

SUMMARY OF THE INVENTION

The invention provides for this purpose a test device. In a preferred embodiment the transport path for supplying a carrier connects onto the transport path for discharging a carrier. In another preferred embodiment the transport path for supplying a carrier runs at least partly parallel to at least a part of the transport path for discharging a carrier. Using this test device a whole carrier with a plurality of electronic components mounted thereon can be engaged in one operation. The engaged carrier and/or the electronic components mounted thereon can now be placed into contact, once or a number of times at different positions, with one or more test contacts. A significant advantage of the device according to the invention is that the time required for testing an electronic component can be considerably reduced. Fewer separate objects are carried into the test device. Another advantage of the test device according to the invention is that the accuracy of positioning of the component relative to the contacts increases so that the quality of contact improves and becomes more constant. The carrier does after all contain the original reference points (also designated as index holes) on the basis of which previous operations have taken place. When the electronic components are separated for the test device, use must be made for later positioning of derived reference points such as for instance a moulded housing. It will be apparent that use of the original reference points on the carrier enables a more precise positioning of the objects for testing. The accuracy of the measurement will hereby increase, whereby fewer products are unnecessarily rejected as a result. Yet another advantage of the test device according to the invention is that it enables testing relatively early in the production process, so that relatively quicker feedback is possible when errors are detected and whereby possibly expensive further operations can be dispensed with. Because a carrier for testing is taken from a supply path and a tested carrier is placed in a discharge path, a plurality of testing devices can be deployed parallel to each other for testing a production flow of carriers. The capacity of the testing device does not therefore need to form a bottle-neck in a production process. The supply and discharge of carriers can take place via a single transport path, in which case it is advisable to record which carriers have been tested and which have not been tested, but it is also possible to use different transport paths for supply and discharge of carriers. In this latter situation there is less necessity for monitoring which carriers have been tested since the presence in the discharge path already indicates that a carrier has been tested. It is however possible in both variants to deploy test devices parallel to each other.

In a preferred embodiment at least one transport path is adapted for transport in two directions. The flexibility of the test device is hereby further increased, particularly in respect of the arrangement in which it is used.

The manipulator is preferably provided with two substantially mutually perpendicular linear guides for displacing the manipulator in a plane. The manipulator can herein also be provided with a third linear guide which lies substantially perpendicular to the other two linear guides. Such a manipulator enables a precise positioning of the carrier relative to the test contact. It is also possible to use such a manipulator for placing carrier and test contact into mutual contact a number of times, for instance at different locations on the carrier. A precise positioning of carrier relative to test contact is then also possible. An advantage already described above is the short transporting time required between two measurement on the same carrier. Yet another advantage of the manipulator with linear guiding is that it is relatively inexpensive to manufacture and is easily maintained.

In yet another preferred embodiment, the test device is provided with identification means for identification of an individual carrier. The test results of determined positions on the carrier can thus be linked to the individual carrier so that in optional further processing of a carrier the test results can be taken into account.

In yet another preferred embodiment, the manipulator is provided with positioning means for positioning the carrier relative to the manipulator. Using the positioning means the manipulator can be positioned on the carrier relative to the original reference points.

For processing of the test data the test device preferably comprises a computer system which is connected to the test contact. In practice such a computer system is a number of times more expensive (for instance by a factor 4) than the test device itself. The productivity increase of the test device according to the invention compared to the prior art also entails that the productivity of the relatively expensive computer system also increases. Reduction of the processing time per measurement thus provides an advantage which extends beyond more optimal utilization of the test device without peripheral equipment.

The invention also provides a test assembly for testing electronic components mounted on a carrier such as a lead frame. Such a test assembly can operate as stand-alone unit but can also be built into a production line. In addition, one or more test devices can be incorporated in the test assembly as required.

The invention moreover provides a method for testing components mounted on a carrier such as a lead frame. A carrier can herein be tested during step C) by placing it in contact with a test contact. It is also possible for a carrier and/or components mounted on a carrier to be tested a number of times by placing these in contact with the test contact at a plurality of positions. It is also further possible to test the carrier and/or components mounted on a carrier a number of times by placing them in contact with a plurality of test contacts. This can take place simultaneously as well as successively. By taking a whole carrier with electronic components mounted thereon out of a transport path the advantages are obtained as already described above with reference to the device according to the invention. The relatively simple method enables it to be performed with a relatively simple device. Measurements can be performed at relatively high temperatures (100–200° C.) but it is also possible to perform the method at relatively low temperatures (−60–−20° C.). The device according to the invention can be used for cold as well as hot test conditions.

Depending on the conditions in which the test is carried out, the carrier can be taken before testing out of the same transport path as, or out of a different transport path from the one in which it is placed after testing. In a stand-alone application of the method, a single transport path may for instance suffice but in a situation where the method is performed simultaneously at different positions a multiple transport path is preferred.

The present invention will be further elucidated with reference to the non-limitative embodiments shown in the following figures. Herein:

DETAILED DESCRIPTION OF THE PREFERRED EMBODIMENTS

Figure 1:
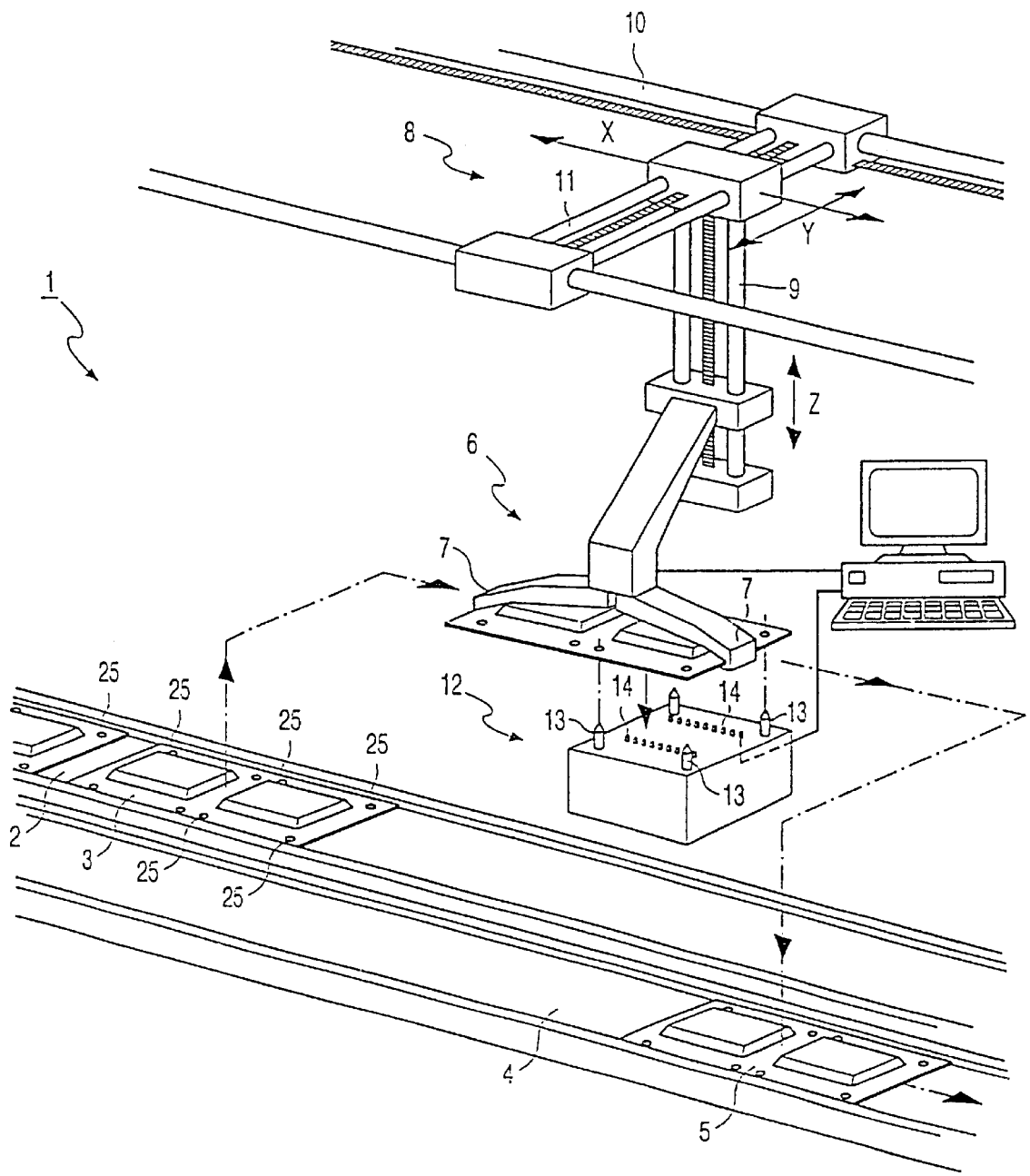
FIG. 1 shows a schematic perspective view of a device according to the invention.

FIG. 1 shows a test device 1 with a feed conveyor 2 along which a lead frame 3 for testing is supplied. When lead frame 3 has reached a determined position it will be engaged by a manipulator 6 which is provided for this purpose with movable rippers 7. Manipulator 6 is movably suspended by means of a frame 8. In this frame 8 is arranged a vertical linear guide 9 (Z-axis) with which manipulator 6 is displaceable in vertical direction. Also arranged in frame 8 are two horizontal linear guides 10, 11 which lie perpendicularly of one another. Manipulator 6 is movable by horizontal linear guides 10, 11 in a plane which lies at least partly above feed conveyor 2 for lead frame 3 and a discharge conveyor 4 for discharge of tested lead frames 5.

After a lead frame 3 for testing has been taken from feed conveyor 2, manipulator 6 is moved to above a test contact 12. This test contact 12 is provided with positioning pins 13 which co-act with index holes 25, which are arranged in lead frames 3 for testing. As an alternative it is also possible to provide the manipulator 6 with positioning pins 13 cooperating with recesses in the test contact 12. When manipulator 6 is situated with a lead frame 3 for testing above test contact 12, manipulator 6 will be moved downward by the vertical linear guide 9 such that positioning pins 13 engage in the index holes of lead frame 3. When manipulator 6 is moved downward the lead frame 3, or an electronic component mounted thereon, will make contact with the conducting stops 14 arranged on test contact 12. The measurement can subsequently be performed, and this will be further discussed with reference to FIG. 3;

After performing of the first measurement the manipulator 6 is moved a limited distance upward such that lead frame 3 is released from positioning pins 13. Subject to the test programme to be run, lead frame 3 can now be displaced through a limited distance in X or Y direction to then be moved downward again so that a subsequent test can be carried out with lead frame 3. A number of tests can thus be performed on a single lead frame 3. Usually The number of tests to be carried out will usually correspond with the number of electronic components arranged on lead frame 3. Because in the case of successive measurements on the same lead frame 3 the relative displacements of lead frame 3 are relatively small, the processing time per test for performing is also limited. In order to perform a number of very diverse tests on the same lead frame 3 for testing a plurality of test contacts 12 of diverse geometry can also be placed in the same test device 1.

After all required tests have been carried out, manipulator 6 is displaced to a position above discharge conveyor 4 on which a tested lead frame 5 is set down by opening grippers 7. Depending on the quantity of lead frames for testing and the complexity of the tests to be performed, one or more test devices 1 can be combined. This combining of a plurality of test devices 1 can be realized relatively simply when feed conveyor 2 and discharge conveyor 4 are separated. However, also when only one combined feed and discharge conveyor is used it is possible to combine a plurality of test devices 1. A control system most however be used in this cast which monitors which lead frame 4 lying on the conveyor has already been tested and which lead frame 3 has not yet been tested.

The test device 1 according to the invention has the advantage that very few product-dependent components form part of test device 1. Test device 1 can hereby be changed over relatively quickly for processing of different types of product. The most product-dependent component in test device 1 is the test contact 12 which can be embodied for quick replacement, for instance by means of rapid-action couplings.

Figure 2:
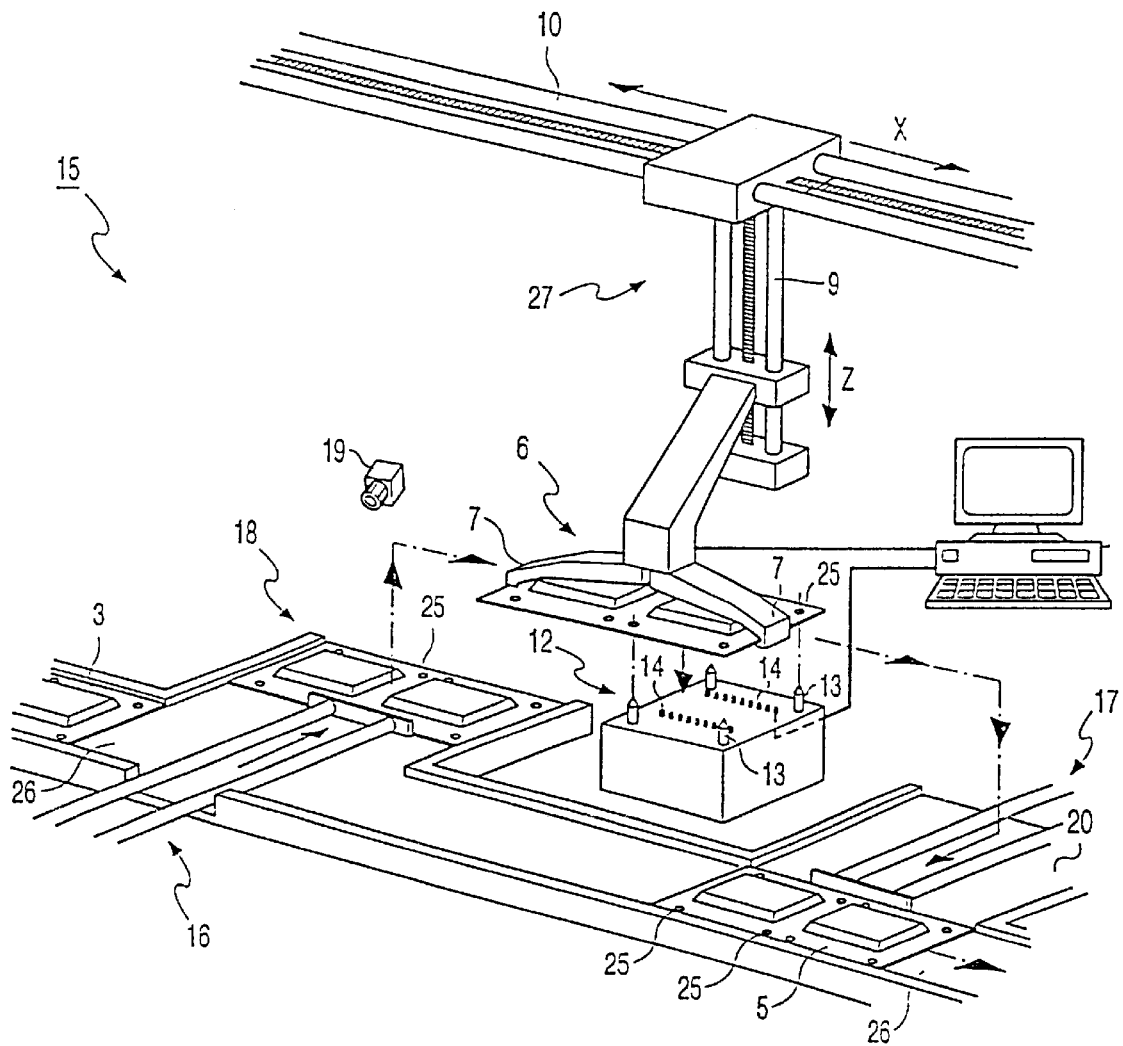
FIG. 2 shows a schematic perspective view of a variant of the device shown in FIG. 1.

FIG. 2 shows a test device 15 in which, in addition to the components shown in FIG. 1, two transfer devices 16, 17 are also arranged for removing a lead frame 3 for testing from a transport track 26 and placing a tested lead frame 5 after testing on the transport track 26. A lead frame 3 is displaced to an infeed station 18 above which is disposed a camera 19. A first visual inspection of lead frame 3 can be performed herewith. The camera 19 can also be equipped as a data code reader for reading a code marking a lead frame and identifying it. Based on this information a link can be made relating a test result and individual components on the lead frame 3. The information can be used for selectioning of the tested components later on. Manipulator 6 engages lead frame 3 in infeed station 18 and moves it to test contact 12 where the tests as described above are carried out. After the tests have been performed the tested lead frame 5 will be placed by manipulator 6 in an outfeed station 20. In addition to camera 19 placed at the infeed station 18, it is also possible for other test equipment to be deployed close to infeed station 18 and outfeed station 20.

The test device 15 is provided with a frame 27 for carrying the manipulator 6 that is less complete than the frame 8 showed in FIG. 1. The frame 27 creates freedom for the manipulator 6 in only two directions, the X- and Z-axis. As freedom in the Y direction, as showed in test device 15 in FIG. 1, is superfluous because of the transfer devices 16, 17 the frame 27 can be relatively simple.

The transfer devices 16, 17 increase the capacity of test device 15 in that manipulator 6 only has to displace a lead frame 3, 5 over a limited distance, since the operations by transfer devices 16, 17 and manipulator 6 can take place in parallel manner, the productivity of test device 15 is greater than that of test device 1. In addition, infeed and outfeed stations 18, 20 enable additional inspections.

Figure 3:
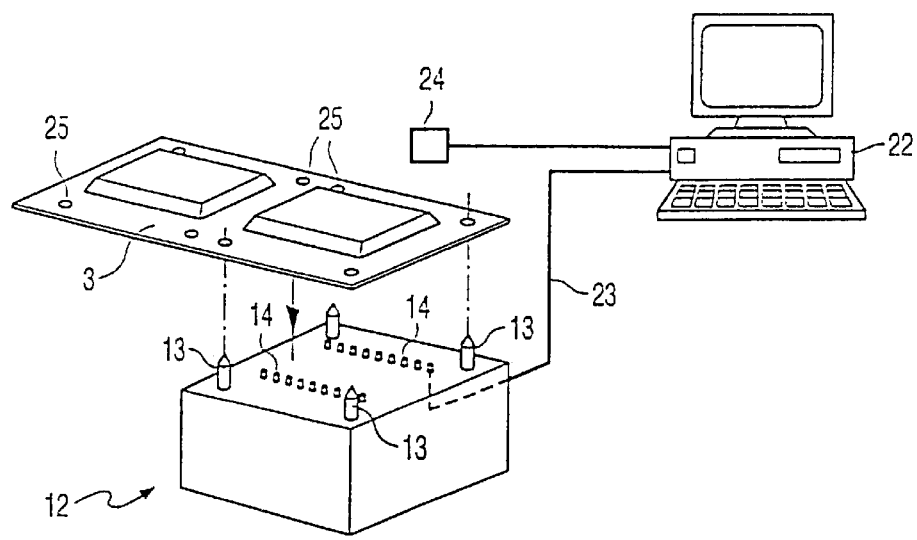
FIG. 3 shows a schematic view of a part of the device as shown in FIGS. 1 and 2 which is coupled to a computer.

FIG. 3 shows schematically a computer 22 as visualization of a so-called test system which in practice consists of a mainframe with relatively complex test software. An individual test system 22 is used per test device 1, 15. Test system 22 is connected by means of a signal line 23 to the conducting stops 14 of test contact 12. Also shown schematically is a sensor 24 which is accommodated in manipulator 6 for identification of an engaged lead frame 3. The test results of a lead frame 3 can thus be linked to the identity of lead frame 3.

What is claimed is:

1. A test device for testing electronic components, comprising:
   a lead frame on which a plurality of electronic components may be mounted for testing wherein the lead frame is arranged with index holes;
   a lead frame supply transport path;
   a manipulator for engaging and displacing a supplied lead frame;
   a test contact with which a lead frame and/or at least one component mounted on the lead frame can be placed in contact by the manipulator wherein the test contact is provided with positioning pins which co-act with the index holes arranged in the lead frame;
   a lead frame discharge transport path;
   wherein at least one of said transport paths is continuous and leads along the test contact; and
   wherein the manipulator for engaging and displacing a supplied lead frame is equipped for taking a lead frame from the supply transport path and, after displacing and testing the lead frame, the manipulator places the tested lead frame in said discharge transport path.

2. The test device as claimed in claim 1, wherein the transport path for supplying a lead frame is connected to the transport path for discharging a lead frame.

3. The test device as claimed in claim 1, wherein the transport path for supplying a lead frame runs at least partly parallel to at least a part of the transport path for discharging a lead frame.

4. The test device as claimed in claim 1, wherein at least one transport path is adapted for transport in two directions.

5. The test device as claimed in claim 1, wherein the test device comprises identification means for identification of an individual lead frame.

6. The test device as claimed in claim 1, wherein the test device also comprises a computer system for processing test data, which computer system is connected to the test contact.

* * * * *

UNITED STATES PATENT AND TRADEMARK OFFICE
CERTIFICATE OF CORRECTION

PATENT NO. : 6,507,185 B1
DATED : January 14, 2003
INVENTOR(S) : Willem Antonie Hennekes et al.

It is certified that error appears in the above-identified patent and that said Letters Patent is hereby corrected as shown below:

Column 1,
Line 8, after "components" delete "mounted on a carrier such as a lead frame or substrate."
Line 23, after "is performed." insert --The United States patent US 5 151 650 discloses a semiconductor device handler which transports a number of packaged semiconductor devices in a boat to a test head. Boats loaded with semiconductors are transported from an input staging section to a testing section. In the testing section the loaded boat together with boat grasps that are connectable with the input staging section are lifted to make the semiconductors contact with a number of test pockets of the test head. After testing the semiconductor devices the boat grasps are lowered and are put in a position to connect with an output staging section.--

Lines 26-27, after "take place" delete "in accurate manner at relatively high speed." and insert -- in a more flexible and accurate manner at relatively high speed. --
Line 36, "a whole carrier" should read -- a carrier --.
Line 37, after "mounted thereon can be" delete "engaged in one operation." and insert --taken from a continuous transport path to be tested while the transport path stays operable during the testing, thus enabling a flexible number of test devices cooperating with one or more transport paths. The test device according to the invention is also very flexible in the handling of the carriers on distance of the transport path making various testing operations on the carriers possible.--

Line 43, after "considerably reduced." delete "Fewer" and insert -- As the electronic components are mounted on the carrier fewer --.
Line 47, after "contacts increases" insert -- because of the fixed orientation of the electronic components on the carrier --.

UNITED STATES PATENT AND TRADEMARK OFFICE
CERTIFICATE OF CORRECTION

PATENT NO. : 6,507,185 B1
DATED : January 14, 2003
INVENTOR(S) : Willem Antonie Hennekes et al.

It is certified that error appears in the above-identified patent and that said Letters Patent is hereby corrected as shown below:

<u>Column 2,</u>
Between lines 10 and 11, insert the following three paragraphs:
-- The UK patent application GB 2 285 139 discloses a method for testing electronic devices attached to a lead frame. Before testing the electronic devices are separated one from one another. The electronic devices are after separation positioned at a test site beneath a test fixture to contact the test fixture.
-- The United States patent US 5 686 834 discloses a handling system which carries a carrier carrying a plurality of IC devices to subject the IC devices to testing. At least one test unit is combined with a loader/unloader for transferring IC devices from a container to a carrier and carrier transfer units are combined with the test units to transfer the carrier from the loader/unloader unit to the corresponding test units.
-- The International patent application WO 92/04989 discloses an electronic device test handler for automatically presenting electronic devices to a tester for testing. A plurality of carriers, each for carrying a set of electronic devices, are cyclically conveyed in a close loop. The electronic devices are unloaded from each carrier to be tested. --

<u>Column 3,</u>
Between lines 20 and 21, insert the heading -- BRIEF DESCRIPTION OF THE DRAWINGS --.
Line 25, delete "BRIEF DESCRIPTION OF THE DRAWINGS".
Line 65, after "FIG. 3" delete semicolon and insert period -- . --.

<u>Column 4,</u>
Line 6, "Usually The" should read -- Usually the --.
Line 26, "control system most" should read -- control system must --.
Lines 26-27, "in this cast" should read -- in this case --.

UNITED STATES PATENT AND TRADEMARK OFFICE
CERTIFICATE OF CORRECTION

PATENT NO.    : 6,507,185 B1
DATED         : January 14, 2003
INVENTOR(S)   : Willem Antonie Hennekes et al.

It is certified that error appears in the above-identified patent and that said Letters Patent is hereby corrected as shown below:

<u>Column 4 cont'd,</u>
Line 61, "showed in FIG. 1" should read -- shown in FIG. 1 --.
Line 63, "as showed" should read -- as shown --.

Signed and Sealed this

Twenty-eighth Day of October, 2003

JAMES E. ROGAN
*Director of the United States Patent and Trademark Office*